US005111487A

United States Patent [19]

Burch

[11] Patent Number: 5,111,487

[45] Date of Patent: May 5, 1992

[54] ELECTRONIC TIMER APPARATUS

[75] Inventor: Kenneth R. Burch, Austin, Tex.

[73] Assignee: Motorola, Inc., Schaumburg, Ill.

[21] Appl. No.: 384,219

[22] Filed: Jul. 24, 1989

[51] Int. Cl.[5] .............. H03K 23/00

[52] U.S. Cl. .............. 377/44; 377/110; 368/70; 368/188

[58] Field of Search ... 364/200 MS File, 900 MS File; 377/20, 44; 328/129.1, 130.1; 368/69, 70, 118, 159, 185, 186, 187, 188, 189

[56] References Cited

U.S. PATENT DOCUMENTS

| | | | |
|---|---|---|---|
| 4,033,108 | 7/1977 | Bennett et al. | 368/70 |
| 4,182,108 | 1/1980 | Chihara | 368/70 X |
| 4,245,338 | 1/1981 | Sekiya et al. | 368/188 |
| 4,263,666 | 4/1981 | Murata | 368/188 X |
| 4,390,780 | 6/1983 | Wu et al. | 377/44 |
| 4,431,314 | 2/1984 | Portmann | 368/188 |
| 4,477,918 | 10/1984 | Nossen et al. | 377/44 X |
| 4,489,422 | 12/1984 | Paradise et al. | 377/44 X |
| 4,879,733 | 11/1989 | Burch et al. | 377/44 |

*Primary Examiner*—Thomas M. Heckler

*Attorney, Agent, or Firm*—Vincent B. Ingrassia; Thomas G. Berry

[57] ABSTRACT

Modulo timer apparatus including a chain of modulo counter stages is controllable by write signals generated by a central controller. The central controller is operative to generate a write signal corresponding to a selected counter stage, and a digital control signal. The initial counter stage of the chain includes a selecting circuit controlled by the digital control signal to couple either a reference clock signal or the corresponding write signal to the initial counter stage to alter the count thereof. Each successive counter stage includes a corresponding selecting circuit also controlled by the digital control signal to couple either a pulse signal generated from the preceding counter stage as it counts through its modulus value or the corresponding write signal to the successive counter stage to alter the count thereof. In one embodiment, the timer apparatus is a real time clock including at least seconds, minutes, and hours modulo counter stages which are interconnectly responsive to a reference time base clock signal to accumulate a count indicative of the real time. A method of testing the plurality of interconnected counter stages of the timer apparatus utilizing the write signals generated by the central controller is also described.

18 Claims, 4 Drawing Sheets

ELECTRONIC TIMER APPARATUS

REFERENCES TO RELATED COPENDING APPLICATION

The application entitled "Timer Architecture For Multi-Task Computers and For Serial Data Decoding" bearing U.S. Pat. No. 4,879,733 was filed Jan. 28, 1988, by Kenneth R. Burch and assigned to the same assignee as the instant application.

BACKGROUND OF THE INVENTION

The present invention relates to electronic timer apparatus, in general, and more particularly to an electronic timer comprising a plurality of modulo counter stages controllable by write signals generated by a central controller and a method for testing the same.

Electronic timers may comprise a string of modulo counter stages responsive to a reference clock signal for counting up or down. Each counter stage counts through its corresponding modulus value before a successive counter stage may be altered in count. Electronic timers have numerous applications in a variety of commercial and industrial products. An example of one type of application is as a real time clock in which the first counter stage has a modulus value of 60 for seconds, the second counter stage has a modulus value of 60 for minutes, the third counter stage has a modulus value of 12 or 24 for hours, and so on.

Electronic timers of the aforementioned type generally include complex additional circuitry to reliably set and test the modulo counter stages thereof. For those electronic timers which are controlled by a central controller, it is a common practice in the industry to write to, as well as read from, the various counter stages over a common data bus. This operation renders the timer even more complex in design.

Some electronic timers, such as real time clocks, for example, are implemented in portable, battery operated devices, such as wristwatches, radio receivers, and pagers, and the like, which coordinate operations through a central controller. Such portable devices generally include battery saving techniques which maintain a lower voltage potential for the counter stages of the real time clock to offer non-volatility thereof at reduced power, while the central controller and processing circuitry may operate at a higher voltage which is cycled off and on at prescribed intervals to conserve power consumption. In this example, all of the data and control lines between the processing circuitry of the central controller and the various counter stages of the real time clock include bidirectional voltage level translation circuits adding further to the complexity in the design of the electronic timer.

Still further, electronic timers, especially for application in portable, battery operated electronic devices, are implemented in an integrated circuit and more particularly on a single substrate with other processing and memory related circuits, the emphasis being in miniaturization and reduced energy consumption thereof. However, as the timer apparatus becomes more and more complex to compensate for the aforementioned features and drawbacks, the area needed on silicon and energy consumption is increased.

The present invention provides for a much simpler electronic timer architecture, one which is controllable by a central controller and operated at a lower voltage level than that of the central controller. The improved timer architecture is relatively small in size. needs no special test logic and thus affords higher operational performance with regard to the setting and testing thereof while consuming less power. More specifically, the improved timer architecture needs no parallel loading in the setting and testing thereof, thus requiring only one-way voltage level translation circuits. These and other benefits will become more evident from the following description of the preferred embodiment taken together with the accompanying drawings.

SUMMARY OF THE INVENTION

In accordance with the present invention, modulo timer apparatus includes at least one counter stage of a predetermined first modulus value having an input for receiving a clock signal, and a plurality of outputs indicative of the digital count of the stage, and is controllable by a central controller which is operative to generate a write signal corresponding to a selected counter stage, and a digital control signal. The timer apparatus includes a selecting means controlled by the digital control signal to couple one of a reference clock signal and corresponding write signal to the input of the at least one counter stage to alter the count thereof.

In addition, the one counter stage may include an output for providing a pulse signal each time the counter stage counts through its modulus value. The timer apparatus may further include one or more successive counter stages, each of a predetermined second modulus value, having an input for receiving a clock signal, a plurality of outputs indicative of the digital count of the counter stage and an output for providing a pulse signal each time the successive counter counts through its modulus value. Another selecting means is provided for each successive counter stage and is controlled by the digital control signal to couple one of the pulse signal from the preceding counter stage and corresponding write signal to the input of the corresponding successive counter stage to alter the count thereof.

In one embodiment, the timer apparatus is a real time counter including at least seconds, minutes and hours modulo counter stages interconnectly responsive to a reference time base clock signal to accumulate a count indicative of the real time.

In another embodiment, the central controller is operated at a first voltage potential and the one and successive counter stages are operated at a second voltage potential. The timer apparatus includes a voltage translator for each write signal coupled between the central controller and corresponding selecting means for effecting a voltage translation of the corresponding write signal from the first voltage potential to the second voltage potential.

Still further, a method of testing the plurality of interconnected counter stages comprises the steps of controlling the disconnection of the counter stages by the central controller rendering each stage unresponsive to the reference clock signal and preceding counter stage; setting the counter stages to a predetermined count by the central controller; selecting a counter stage by the central controller; generating write signals by the central controller to the selected counter stage to attempt to sequentially set each bit of the counter stage exclusively to a predetermined digital state; reading the contents of the selected counter stage by the central controller with each set attempt to determine if the intended bit was set to the predetermined digital state; and repeating the aforementioned steps for each counter stage of the plurality.

DESCRIPTION OF THE PREFERRED EMBODIMENT

Figure 1:
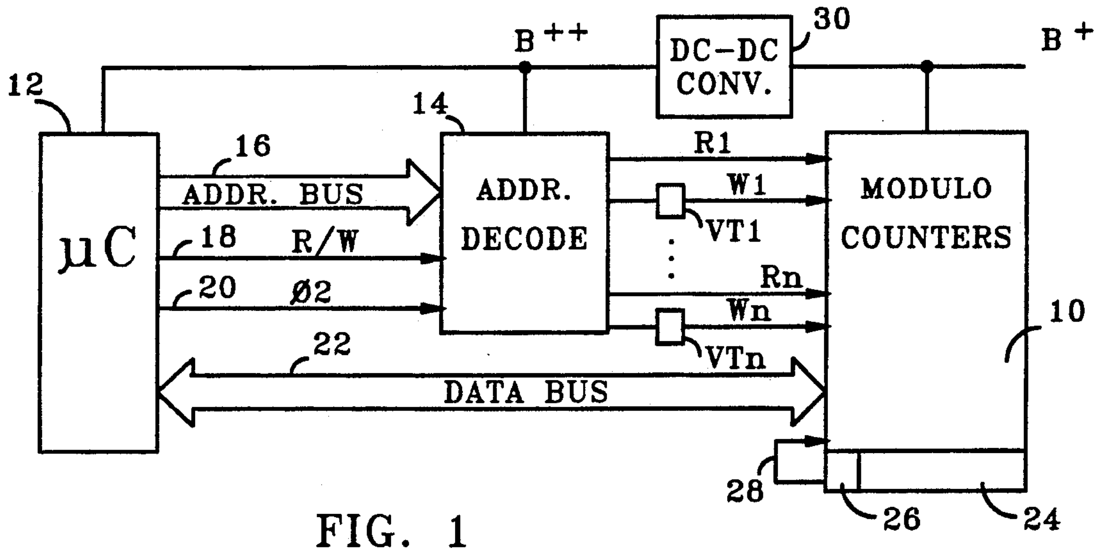
FIG. 1 is a block diagram schematic of electronic timer apparatus controlled by a central controller suitable for embodying the principles of the present invention.

In the block diagram schematic of FIG. 1, an electronic timer circuit comprising a string of modulo counters is shown by the block 10 and a central controller is depicted as comprising a microcomputer 12 and an address decoder 14. The microcomputer 12 generates address signals over an address bus 16, a read and write signal over a signal line 18 and one phase of a operational clocking signal $\phi 2$ over signal line 20. The signal lines 16, 18 and 20 are coupled to the address decoding 14 for processing thereby to generate read and write signals R1-Rn and W1-Wn, respectively, which are coupled to respectively corresponding modulo counters 1-n of the electronic timer 10. A data bus 22 is coupled between the timer 10 and microcomputer 12 for conducting data signals therebetween.

A control register 24 may be coupled to the microcomputer 12 via corresponding read/write line and the data bus 22 for setting and reading digital control bits thereof. One such bit 26 is settable by the microcomputer 12 for generating a digital control signal 28 which is coupled commonly to the modulo counter stages of the timer 10.

Power is supplied at a first voltage potential $B^+$ to the modulo counter stages of the timer 10 from a source of power which may be a single cell battery or the like. The voltage level $B^+$ may be regulated, in the present embodiment, at approximately 1 volt or so. Also in the present embodiment, the voltage level $B^+$ is converted to a higher voltage level $B^{++}$, which may be on the order of 3 volts or so, using a conventional DC-DC converter 30 to supply power to the microcomputer 12 and address decoder 14. Because of the different operating voltage potentials of the central controller and timer, voltage translators VT1-VTn are disposed in the write signal lines W1-Wn, respectively, for effecting a voltage translation of the corresponding write signal from the voltage potential $B^{++}$ to the voltage potential $B^+$.

Figure 2:
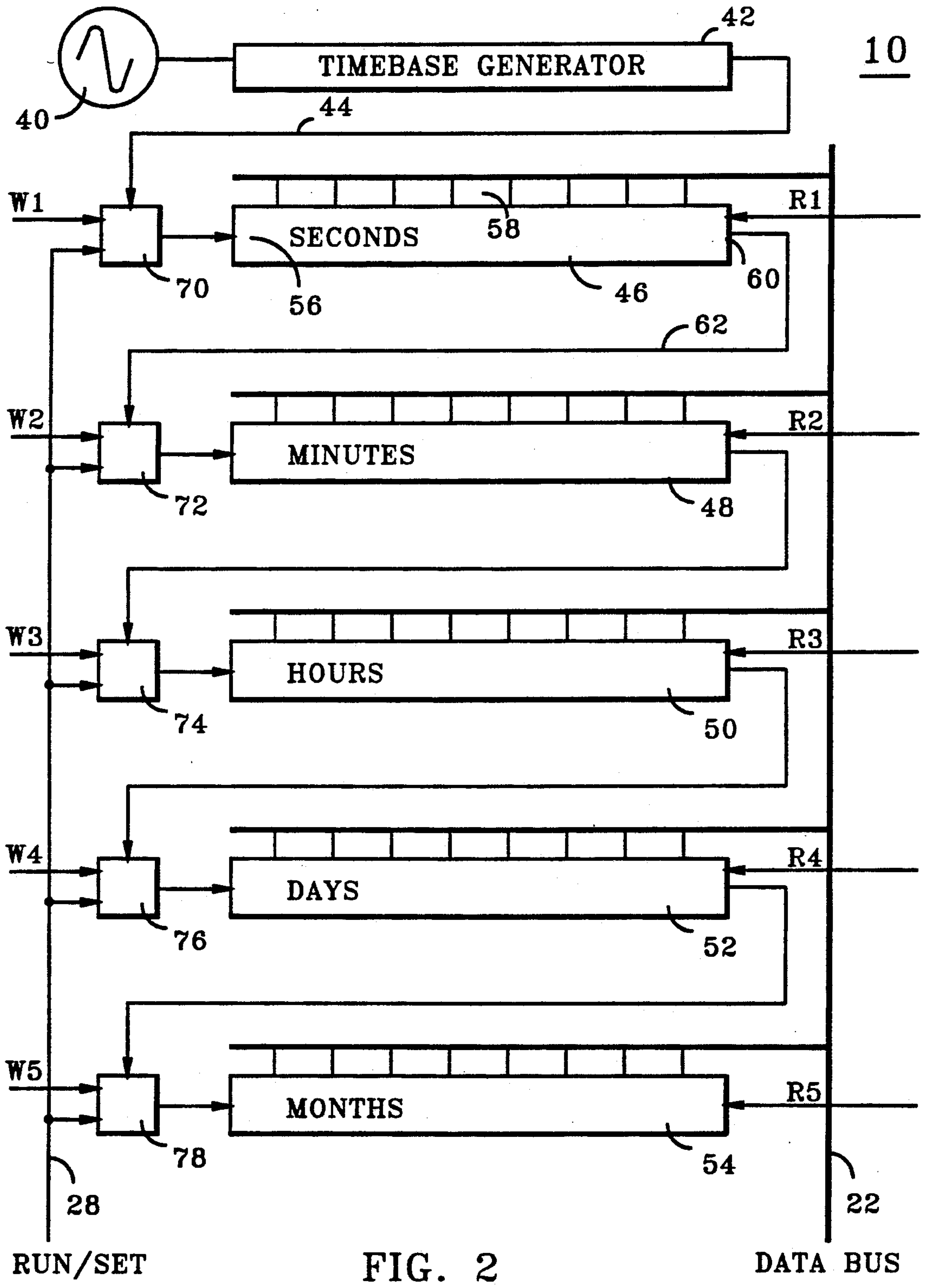
FIG. 2 is a block diagram schematic of an embodiment of a electronic timer with a plurality of counter stages suitable for use in the embodiment of FIG. 1.

In the present embodiment, the electronic timer 10 is embodied as a real time clock having fixed or predetermined modulo counter stages as seconds, minutes, hours, days and months as shown in the block diagram schematic of FIG. 2. Referring to FIG. 2, a stable reference oscillator 40 which may be of the crystal control variety generates a reference oscillator signal which may be on the order of 32.768k, for example. A conventional time base generator 42 divides down the reference oscillator signal to effect a 1 Hz reference time base clock signal 44 which is conducted to the modulo counter stages of the timer 10 for altering the count thereof. An initial or seconds counter stage 46 is configured as a fixed modulo counter having a modulus value of 60. Successive counter stages 48 and 50 representing minutes and hours, may have fixed modulus values of 60 and 24, respectively. The timer may also include further successive stages 52 (days) and 54 (months) which may have fixed modulus values of 30 and 12, respectively. Each counter stage has an input 56 for receiving a clock signal, a plurality of outputs 58 for providing a digital code indicative of the digital count of the stage and an additional output 60 for providing a pulse signal over signal line 62 each time the corresponding counter stage counts through its modulus value. For example, for the initial stage 46, a pulse signal is generated over the signal line 62 each time the counter stage counts through 60 seconds and so on.

An electronic selecting device 70 is coupled to the initial stage 46 and controlled by the digital control signal 28 to couple one of the reference clock signal 44 or the corresponding write signal W1 to the input 56 to alter the count thereof. Other electronic selecting devices 72, 74, 76 and 78 may be coupled respectively to the successive counter stages 48, 50, 52 and 54 and controlled by the digital control signal 28 to couple one of the pulse signal from the preceding counter stage or the corresponding write signal to the input of the corresponding successive counter stage to alter the count thereof.

For example, when the digital control signal 28 is set by the microcomputer 12 to one state, which may be referred to as the RUN state, the selecting device 70 couples the reference clock signal 44 to the input 56 to control the count thereof and the remaining selecting devices 72, 74,76 and 78 couple the pulse signal from the preceding counter stage to the input of their respective counter stage. In this RUN state, the timer architecture is configured as a conventional real time clock. Conversely, when the digital control signal 28 is set to another digital state, which in the present embodiment is referred to as the SET state, the selecting devices 70–78 respond by coupling the corresponding write signals to the inputs of the respective counter stages 46–54 in which case the write signals are used to affect the count of their corresponding counter stage.

Also, in the present embodiment, the plurality of read signals R1 through R5 are coupled respectively to the counter stages 46,48,50,52 and 54 to couple the plurality of outputs 58 of a read selected counter stage to the data bus for rendering an indication of its count to the central controller or microcomputer 12.

Figure 3:
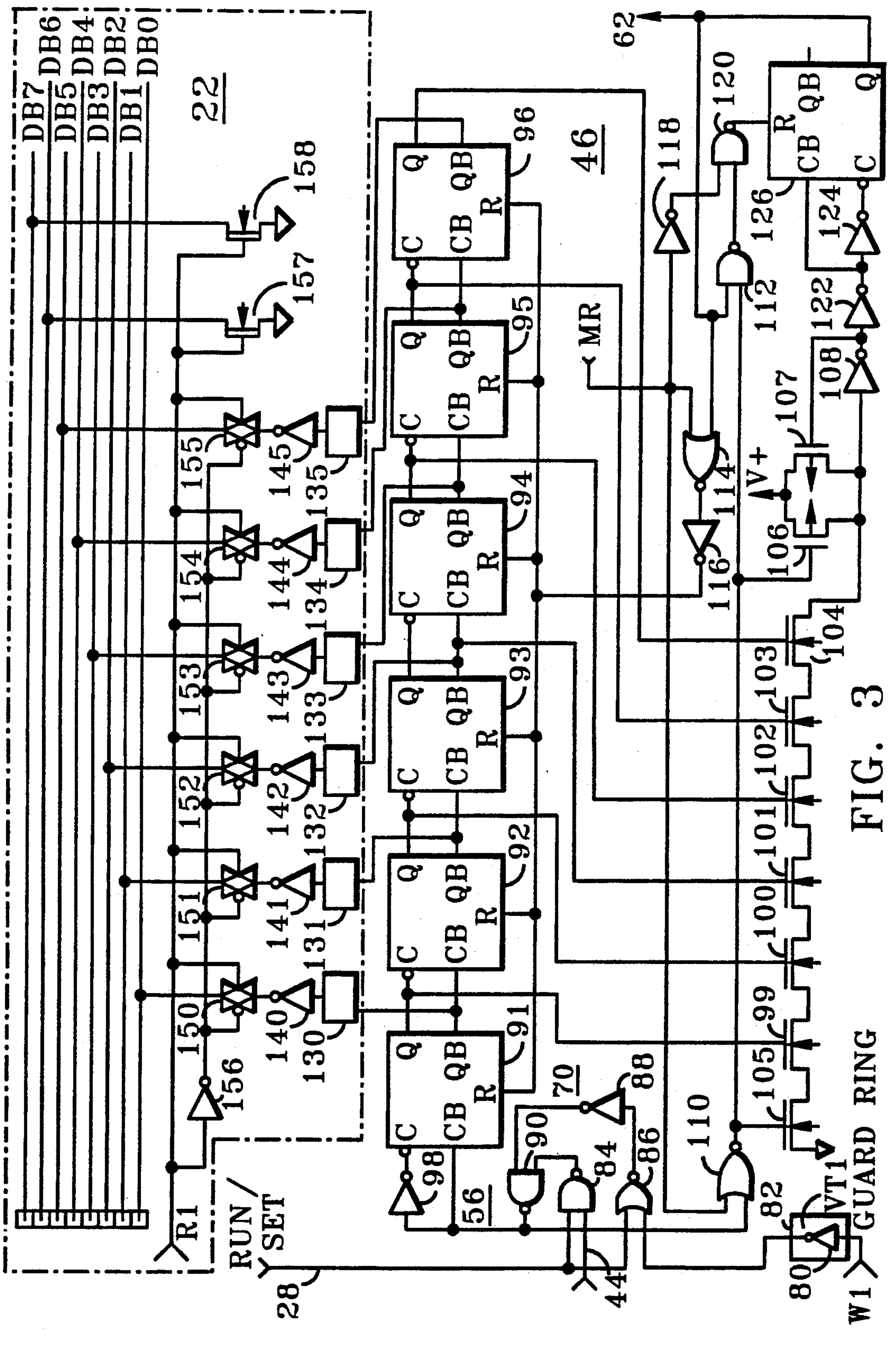
FIG. 3 is a circuit schematic diagram of an exemplary counter stage controllable by a central controller and suitable for use in the embodiment of FIG. 2.

In the present embodiment, the modulo counter stages 46–54 may all be of a similar circuit configuration. An example of such a modulo counter stage is depicted in the circuit schematic of FIG. 3. The initial stage 46 is used for describing the present example, but it is understood that the circuit schematic embodiment of FIG. 3 also applies to successive counter stages 48–54. For purposes of the present description that which is shown within the dot/dashed lines of FIG. 3 represents the circuitry which is powered by the voltage supply $B^{++}$ and the remaining portion of the circuitry as powered by the voltage supply $B^+$. A CMOS logic family may be used to implement the circuit schematic embodiment of FIG. 3.

Referring to FIG. 3, the voltage translator VT1 for the write signal W1 is provided by a CMOS inverter gate 80 powered by the voltage supply B+. To protect against a potential electrostatic coupling through the gate 80 as a result of the high frequency component of the write signal W1, a guard ring 82 is provided around the inverted gate 80 in a common substrate implementation thereof.

In the present embodiment, the electronic selector device 70 comprises a NAND gate 84, a NOR gate 86, an inverter gate 88 and another NAND gate 90. Continuing, the digital control signal 28 is coupled to one input of the NAND gate 84 and NOR gate 86. The reference clock signal 44 is coupled to the other input of the NAND gate 84 and the voltage translated write signal or output of the converter gate 80 is coupled to another input of the NOR gate 86. The output of the NOR gate 86 is coupled through the inverter gate 88 to one input of the NAND gate 90 and the output of the NAND gate 84 is coupled to the other input thereof. The output of the NAND gate 90 is coupled to the input 56 of the modulo counter stage 46.

In operation, when a digital control signal 28 is set by the microcomputer 12 to a binary one state, which represents the RUN mode, the clock signal 44 is coupled through the NAND gate 84 and NAND gate 90 to the counter stage 46 to control the counting thereof. In this RUN state, the NOR gate 86 is disabled and the write signal is inhibited from affecting the count of the counter stage 46. When the digital control signal 28 is set to a binary zero state, which represents the SET mode, the write signal is conducted through the NOR gate 86, and NOR gate 88 and NAND gate 90 to control the count of the counter stage 46 and the NAND gate 84 is disabled which inhibits the clock signal 44 from affecting the count of the stage 46. For the other counter stages, the clock signal 44 may be substituted by the pulse signal from the preceding counter stage and the write signal W1 may be substituted by the write signal of the corresponding counter stage.

In the present embodiment, each modulo counter stage comprises a plurality of flip-flop circuits configured as a ripple counter. For the initial or seconds counter stage 46, six such flip-flops, enumerated 91-96, are used. The flip-flop 91 embodying the least significant bit and the flip-flop 96 the most significant bit of the counter chain. The clock signal input at 56 is coupled to the first stage flip-flop 91 both directly and also through an inverter gate 98. In addition, a tandem chain of NMOS transistors 99-104 corresponding to the flip-flop stages 91-96 embody a decoding stage for setting the modulus value of the counter. The gate of the transistors 99-104 are coupled to the appropriate Q or $\overline{Q}$ output of the corresponding flip-flop stage 91-96 to set a binary code representative of the modulus value. In the present example, the binary code set by the tandem transistor arrangement is 110111 which represents the modulus value of 59.

Continuing with the description of the decoding stage, the transistor 99 is coupled through another NMOS transistor 105 to ground potential and the transistor 104 is coupled to a current mirror circuit configuration comprising NMOS transistors 106 and 107 tied to the power supply. The transistor 104 is also coupled to the input of an inverter gate 108. Still further, a NOR gate 110 has inputs coupled to the clock signal at 56 and a master reset signal MR and has its output coupled to the gate of the transistor 105, to one input of a NAND gate 112 and is also used to drive the gate of the transistor 106 along with the output of the inverter gate 108.

The master reset signal MR is also coupled to one input of a NOR gate 114, the output of which being coupled through an inverter gate 116 to the reset inputs of the chain of flip-flop circuits 91-96. The master reset signal MR is further coupled through an inverter gate 118 to one input of a NAND gate 120. The other input of the NAND gate 120 is coupled to the output of the NAND gate 112. The output of the inverter gate 108 is coupled through a pair of inverter gates 122 and 124 to the clock input of a flip-flop circuit 126. The output of the inverter gate 122 is coupled to the $\overline{\text{clock}}$ input of flip-flop 126. The output of the NAND gate 120 is coupled to the reset input of the flip-flop 126. The Q output of the flip-flop 126 effects the pulse signal output 62 of the counter stage which is also coupled back to the inputs of the NAND gate 112 and the NOR gate 114.

In operation, the flip-flop stages 91-96 are reset either by the master reset signal MR or the pulse signal 62 conducted through the NOR gate 114 and inverter gate 116. Thereafter, the flip-flop stages are controlled to count up to the set modulus value by the clock signal passed through the selector device 70. As the count of the flip-flop stages 91-96 reaches the binary value of its modulus the transistors 99-104 are all effected to their conduction states. Under these conditions and working in relation with the circuit configuration 106, NOR gate 110 and transistor 105, the transistor chain 99-104 effects a signal through the inverter gates 108, 122, 124 to cause the flip-flop 126 to alter its binary state from a zero to a one. The binary one state at 62 is coupled back through NAND gate 112 and NAND gate 120 to reset the flip-flop 126 and cause the output thereof to return to a binary zero state. Accordingly, the binary one pulse thus affected is provided to the succeeding stage and is also conducted through the NOR gate 114 and inverter gate 116 to reset the flip-flop circuits 91-96 to permit them to count through their modulus value once again. In addition, the flip-flop stages 91-96 and 126 may be all reset by the master reset signal MR.

Outputs of the flip-flop circuits 91-96 representing the binary bits of the accumulative count of the counter stage are coupled respectively to a corresponding set of voltage translators 130-135 which convert the binary signals from the B+ voltage potential to the B++ voltage potential. The outputs of the voltage translators 130- 135 are coupled respectively through inverter gates 140-145 to a corresponding plurality of transmission gates 150 -155. In the present embodiment, the data bus 22 comprises 8 parallel lines enumerated DB0-DB7, for conducting an 8 bit digital data word from the timer circuit 10 to the central controller. Accordingly, the transmission gates 150-155 are commonly enabled by the read signal R1 and its converse effected by the inverter gate 156 to couple the outputs of the flip-flop stages 91-96 to the data bus lines DB0-DB5, respectively. In the present embodiment, the data bus lines DB6 and DB7 are coupled through a pair of NMOS transistors 157 and 158 to ground potential which represents a binary zero. The read signal R1 causes the transistors 157-158 to conduct to effect a binary zero on the data bus lines DB6 and DB7 when reading the contents of the modulo counter stage 46. Note that the read signal is coupled to circuitry which is powered at the voltage potential B++, i.e. after the conversion through the voltage translators 130-135, and thus do not require a voltage translator therefor.

While the embodiment of FIG. 3 depicts voltage translators for each of the digital output lines of the counter stages, it is understood that an alternate embodiment may be provided without deviating from the principles of the present invention to provide for a set of voltage translators disposed in the data bus lines between the timer unit 10 and the central controller for effecting the desired voltage translation. However, in this embodiment each of the read signals R1-R5 may include a voltage translator as a result of their coupling to the circuitry operated by the B+ supply. It is also noted that in either embodiment bi-directional voltage translation has been avoided, thus reducing the complexity of the circuitry.

Figure 4:
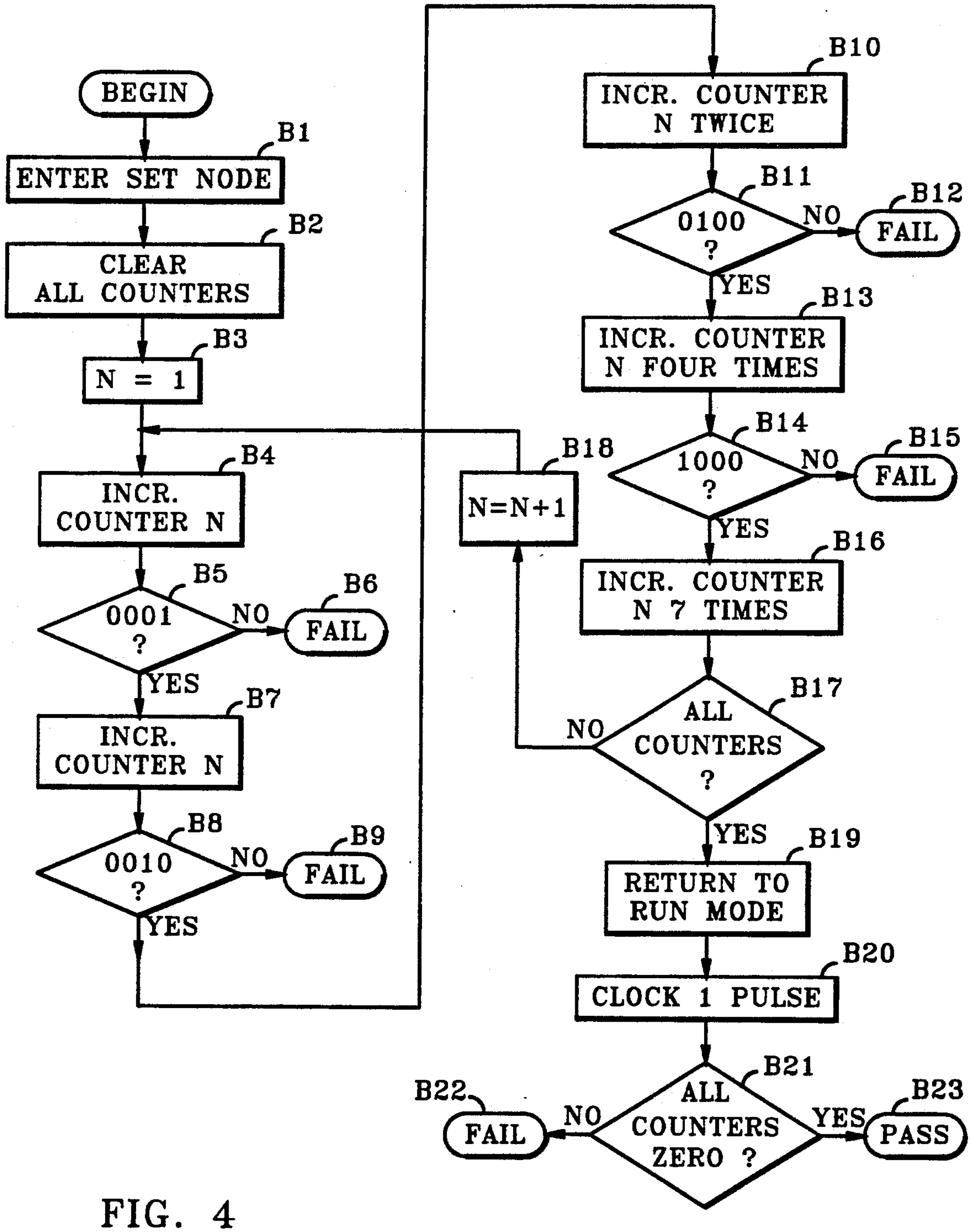
FIG. 4 is a flowchart suitable for use in programming a central controller and exemplifying a method of testing the timer apparatus described in connection with the embodiments of FIGS. 1 and 2.

The flowchart depicted in FIG. 4 may be used to program the microcomputer 12 of the central controller and provide an example of operation of the controlability of the modulo timer apparatus 10 by the central controller. The flowchart of FIG. 4 involves a testing procedure of the individual counter stages as depicted in the embodiment described in connection with FIG. 2. The testing program begins at block B1 which includes instructions to set the digital control bit 26 of register 24 to a binary zero which represents the set mode or test mode of the timer 10. The digital control signal 28 is conducted to each of the selection devices 70-78 as shown in FIG. 2 and FIG. 3 to control selection of the appropriate write signal to control the counting of the respective counter stage. In the next block B2, all of the counter stages are cleared which may be accomplished by controlling the master reset signal MR as shown in FIG. 3.

The next block B3 sets an index N to the first of the counter stages. In the present embodiment, this may be accomplished by generating an address signal over the address bus 16 representative of the first counter stage. The decoder 14 decodes the address and enables only the first stage read and write signals R1 and W1, respectively, to be generated. The signal R/W over signal line 18 determines whether a read or write signal is to be generated. And the clock signal $\phi 2$ over signal line 20 controls the pulsing of the selected read or write signal. While the instant embodiment includes an address decoder 14 responsive to the address signals generated by the microcomputer 12, it is understood by those skilled in the pertinent art that a similar function may be embodied in a software algorithm of the microcomputer 12 which may generate a pulsed read and/or write signal corresponding to a selected counter stage utilizing digital output circuits of a conventional input/output section thereof without deviating from the principles of the present invention.

In the next instructional block B4, the counter 46 is incremented by pulsing the write signal line W1 which is conducted through the selection device 70 to the first stage 91 to set a binary 1 in the least significant bit. Thereafter, in block B5, the counter stage is tested to determine if the least significant bit thereof is set to a binary one. This may be accomplished by the central controller generating a read signal over signal line R1 and reading the outputs of the counter stage over the data bus 22 as described in connection with the embodiment of FIG. 3. If a binary one does not appear at the least significant bit, program flow is diverted to a block B6 which provides an indication of test failure and the test program is discontinued. Otherwise, if the test of block B5 is affirmative, then the counter stage is again incremented by another write signal pulse by block B7 and the next least significant bit is again tested in block B8. Upon detection of failure, program flow is diverted to block B9; otherwise, program flow continues at block B10 where the counter stage may be incremented twice by the write signal W1 and the third binary bit thereof is tested in block B11. Again failure will divert the program flow to block B12; otherwise it continues at block B13.

For this example, the counter is incremented by the instructions of block B13 with four pulses generated over the write signal line W1 and the fourth binary bit of the counter stage is tested in the decisional block B14. Failure diverts the program flow to block B15; else, the counter is again incremented by write signal pulses in block B16. In the present test procedure example, the counter stage is assumed to be a four bit counter having a modulus value of 16. Accordingly, in block B16, the counter is incremented with seven write pulses to cause a count up to the modulus value minus 1.

In the next block B17, it is determined if all of the counter stages have been tested; if not, the index value N is incremented by one, in the instructional block B18, and the program flow continues at the block B4 for the next counter stage. Once all of the counters have been tested by the aforementioned procedure which is determined by the decision block B17, the program flow continues at the instructional block B19 wherein the digital control bit 26 is set to a logical one to return the operation of the timer to the RUN mode. In this mode, the counter stages respond to the reference time base clock signal 44 and the pulse signals produced by their corresponding preceding stages as described in connection with the embodiment of FIG. 2.

In this testing state, all of the counters are set to their modulus values minus one; thus, one more clock pulse permitted to occur by the instructional block B20 causes a ripple through effect resetting all of the counters to their initial count. In the decisional block B21, all of the counters are tested by reading the outputs thereof over the data bus 22 to determine if their binary states are representative of their initial count, which may be all binary zeros, for example, which signifies that the ripple through effect has been accomplished. A failure determined by the block B21 will divert the program flow to block B22 to indicate the failure; otherwise, program flow will be transferred to block B23 to indicate a successful test.

While the foregoing described test procedure in connection with the flowchart of FIG. 4 related to a 4 bit counter stage of modulo 16, it is apparent by all skilled in the pertinent art that such a procedure may be easily extended to include all of the digital bits of a modulo counter necessary to effect any modulus value. For example, for the seconds counter embodiment of FIG. 3 in which the counter stage comprises 6 binary bits, the corresponding test procedure may be extended to include the steps for exclusively setting the 5th and 6th bits to a binary one and the testing thereof and in addition, may include a step to permit the counter thereafter to be incremented to its modulus value of 59. Furthermore, the remaining counter stages of the real time clock described in the embodiment of FIG. 2 may also be tested in accordance with the procedure of FIG. 4 in accordance with their respective number of binary bits and modulus values.

While the present invention has been described in connection with a specific embodiment as depicted in FIGS. 1-4 of the instant application, it is understood that additions, modifications and substitutions may be made thereto without deviating from the broad principles of the present invention. Accordingly, the present invention should not be limited to any single embodiment, but rather construed in broad scope and breadth in accordance with the recitation of the appended claims.

What is claimed is:

1. Modulo timer apparatus controllable by write signals generated by a central controller, said apparatus comprising:

means for generating a reference clock signal;

at least one counter stage of a predetermined first modulus value having an input for receiving a clock signal, and a plurality of outputs indicative of the digital count of said stage;

said central controller operative to generate a write signal to a selected counter stage to control the input of data into the selected counter stage, and for providing a digital control signal;

at least one selecting means coupled to the at least one counter stage and controlled by said digital control signal to couple one of said reference clock signal or corresponding write signal to the input of the at least one counter stage to alter the count thereof.

2. Modulo timer apparatus in accordance with claim 1 wherein the one counter stage includes an output for providing a pulse signal each time said counter stage counts through its modulus value; and including:

at least one successive counter stage of a predetermined second modulus value having an input for receiving a clock signal, a plurality of outputs indicative of the digital count of said stage and an output for providing a pulse signal each time said successive counter counts through its modulus value; and another selecting means for each successive counter stage controlled by the digital control signal to couple one of said pulse signal from the preceding counter stage and corresponding write signal to the input of the corresponding successive counter stage to alter the count thereof.

3. Modulo timer apparatus in accordance with claim 2 wherein the central controller is operative to generate the digital control signal in one of either a RUN state or a SET state; and wherein the one and another selecting means are controlled by the digital control signal in the RUN state to couple the reference clock signal and pulse signal from the preceding counter stage, respectively, to the input of the counter stage corresponding thereto; and wherein the one and another selecting means are controlled by the digital control signal in the SET state to couple the corresponding write signal to the input of the respective counter stage.

4. Modulo timer apparatus in accordance with claim 2 wherein the central controller is operated at a first voltage potential and the one and successive counter stages are operated at a second voltage potential; and including a voltage translator means for each write signal coupled between the central controller and corresponding selecting means for effecting a voltage translation of said corresponding write signal from said first voltage potential to said second voltage potential.

5. Modulo timer apparatus in accordance with claim 4 wherein the central controller is operative to generate a read signal corresponding to a particular one of the at least one selected counter stages and includes a data bus for receiving data signals coupled thereto; and wherein each counter stage includes means responsive to its corresponding read signal to couple the plurality of outputs thereof to the data bus for rendering an indication of its count to the central controller.

6. Modulo timer apparatus in accordance with claim 5 including a voltage translator means for each counter stage coupled between the plurality of outputs thereof and the corresponding coupling means for effecting a voltage translation of said outputs from the second to the first voltage potential prior to being coupled to said data bus.

7. Modulo timer apparatus in accordance with claim 5 including a voltage translator means disposed in the data bus for effecting a voltage translation from the second to the first voltage potential of the data signals conducted from the counter stage selected to be read to the central controller.

8. Modulo timer apparatus in accordance with claim 2 wherein the one and successive counter stages correspond to the stages of a real time clock including at least the clock stages of seconds, minutes and hours.

9. Modulo timer apparatus in accordance with claim 2 wherein the central controller comprises a microcontroller.

10. A method of testing a plurality of interconnected counter stages, each of a predetermined modulo, responsive to a reference clock signal and a preceding counter stage, using a central controller operative to generate red and write signals selectively for each counter stage, said method comprising the steps of:

(a) controlling the disconnection of the counter stages by the central controller rendering each stage unresponsive to the reference clock signal and preceding counter stage;

(b) pre-setting all counter stages to a predetermined count by the central controller;

(c) selecting a counter stage by the central controller;

(d) generating write signals by the central controller to the selected counter stage to attempt to sequentially set each bit of said counter stage exclusively to a predetermined digital state;

(e) reading the contents of the selected counter stage by the central controller with each said attempt to determine if the intended bit was set to the predetermined digital state; and (f) repeating steps (c) through (e) for each counter stage of said plurality.

11. The method of testing in accordance with claim 10 including, between steps (e) and (f), the step:

(e') generating write signals by the central controller to the selected counter stage to render the count thereof one count less than its corresponding modulus value; and including after step (f), the steps:

(g) thereafter, controlling the reconnection of the plurality of counter stages by the central controller to render the counter stages responsive to the reference clock signal and preceding counter stages; and (h) then, after the next reference clock signal, reading the contents of the counter stages by the central controller to determine that all of the counter stages were counted through their respective modulus values.

12. Real time counter apparatus comprising:

means for generating a reference time base clock signal;

at least seconds, minutes and hours modulo counter stages operably interconnected with at least one output of the seconds and minutes modulo counter stages respectively intercoupled to an input of the minutes and hours modulo counter stages and an input of at least the seconds modulo counter stage being coupled to the generating means and responsive to the reference time base clock signal thereof such that the seconds, minutes and hours modulo counter stages accumulate a count indicative of the real time;

a central controller coupled to said seconds, minutes and hours modulo counter stages and operative to generate a write signal corresponding to at least one of said modulo counter stages and for providing a digital control signal; and selecting means, coupled to said central controller, for each modulo counter stage controlled by the digital control signal, the selecting means being responsive to the digital control signal for rendering the corresponding modulo counter stage responsive to one of the reference time base clock signal or the corresponding write signal to alter the count thereof.

13. Real time counter apparatus in accordance with claim 12 wherein the central controller is operated at a first voltage potential and the modulo counter stages are operated at a second voltage potential; and including a voltage translator means for each write signal coupled between the central controller and corresponding selecting means for effecting a voltage translation of said corresponding write signal from said first voltage potential to said second voltage potential.

14. Real time counter apparatus in accordance with claim 13 wherein the central controller is operative to a read signal corresponding to a particular one of the at least one selected counter stages and includes a data bus for receiving data signals coupled thereto; and wherein each counter stage includes means responsive to its corresponding read signal to couple a plurality of outputs thereof to the data bus for rendering an indication of its count to the central controller.

15. Real time counter apparatus in accordance with claim 14 including a voltage translator means for each counter stage coupled between the plurality of outputs thereof and the corresponding coupling means for effecting a voltage translation of said outputs from the second to the first voltage potential prior to being coupled to said data bus.

16. Real time counter apparatus in accordance with claim 14 including a voltage translator means disposed in the data bus for effecting a voltage translation from the second to the first voltage potential of the data signals conducted from the counter stage selected to be read to the central controller.

17. Real time counter apparatus in accordance with claim 12 wherein each modulo counter stage comprises a ripple counter.

18. Real time counter apparatus in accordance with claim 12 wherein the central controller comprises a microcomputer.

* * * * *